Figure 1:
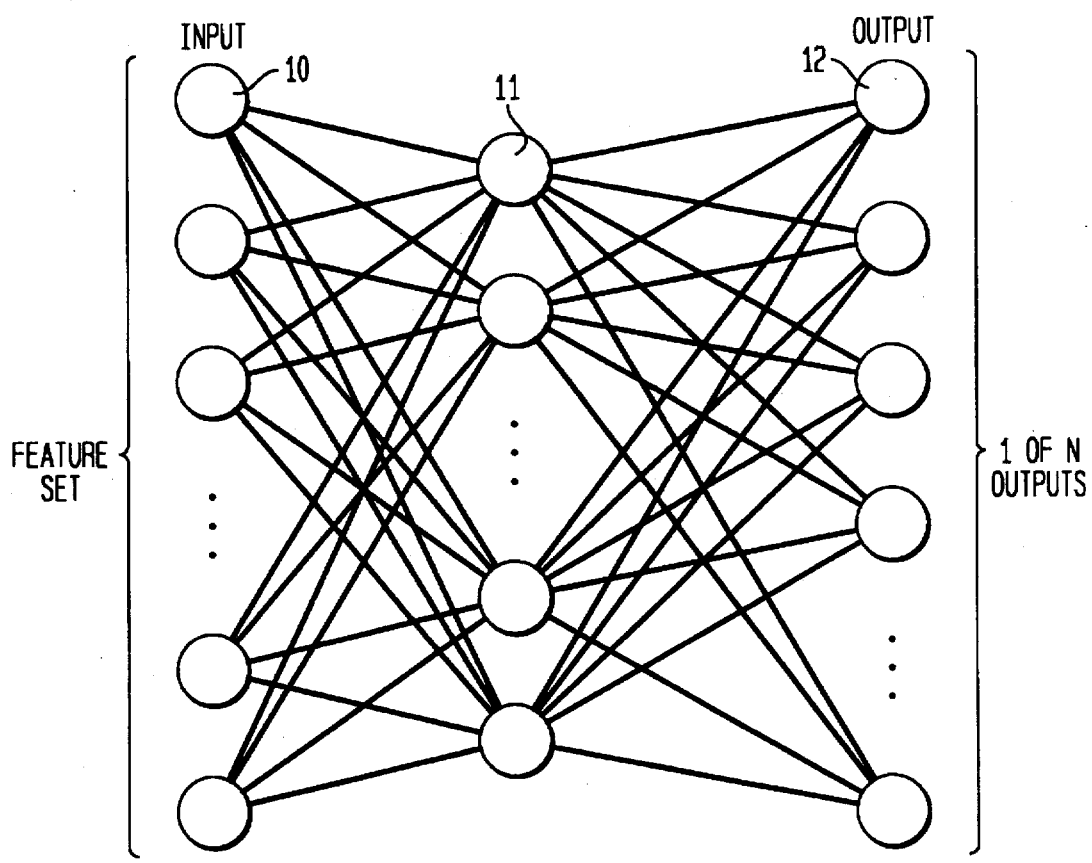

United States Patent [19]
Petsche et al.

[11] Patent Number: 5,675,497
[45] Date of Patent: Oct. 7, 1997

[54] METHOD FOR MONITORING AN ELECTRIC MOTOR AND DETECTING A DEPARTURE FROM NORMAL OPERATION

[75] Inventors: Thomas Petsche, Neshanic Station; Charles Garrett, Plainsboro, both of N.J.

[73] Assignee: Siemens Corporate Research, Inc., Princeton, N.J.

[21] Appl. No.: 651,220

[22] Filed: May 22, 1996

Related U.S. Application Data

[62] Division of Ser. No. 269,465, Jun. 30, 1994, Pat. No. 5,574,387.

[51] Int. Cl.[6] ................................................ G01R 23/00
[52] U.S. Cl. ........................ 364/485; 324/772; 318/806
[58] Field of Search ................................ 364/485, 483, 364/492, 494; 395/902–907, 912–915; 361/24, 25, 30, 31, 5; 318/635, 434, 806; 324/772

[56] References Cited

U.S. PATENT DOCUMENTS

| | | | |
|---|---|---|---|
| 4,581,711 | 4/1986 | Hirata et al. | 364/550 |
| 4,623,967 | 11/1986 | Naimer | 364/483 |
| 4,939,437 | 7/1990 | Farag et al. | 361/24 |
| 5,155,797 | 10/1992 | Nomura et al. | 318/799 |
| 5,296,794 | 3/1994 | Lang et al. | 318/715 |
| 5,373,205 | 12/1994 | Busick et al. | 318/434 |
| 5,436,784 | 7/1995 | Schweitzer, III et al. | 361/25 |
| 5,574,387 | 11/1996 | Petsche et al. | 318/806 |
| 5,576,632 | 11/1996 | Petsche et al. | 318/306 |

*Primary Examiner*—James P. Trammell
*Attorney, Agent, or Firm*—Adel A. Ahmed

[57] ABSTRACT

A method for detecting a departure from normal operation of an electric motor comprises the steps of modelling a set of normal current measurements and a set of operational current measurements for the motor being monitored. The modelling is carried out by a neural network auto-associator which is trained to reproduce its inputs on its output. A potential failure is indicated whenever the set of normal current measurements and the set of operational current measurements differ by more than a predetermined criterion.

4 Claims, 2 Drawing Sheets

1

METHOD FOR MONITORING AN ELECTRIC MOTOR AND DETECTING A DEPARTURE FROM NORMAL OPERATION

This is a divisional of application Ser. No. 08/269,465 filed Jun. 30, 1994, now U.S. Pat. No. 5,574,387 issued Nov. 12, 1996.

The present invention relates to an apparatus and method for indicating and diagnosing faults in electrodynamic machinery. More specifically, the invention relates further to a system for monitoring an electric induction motor and for indicating whether the motor is functioning properly or that it contains an internal fault which will lead to mechanical breakdown. The invention further relates to subsystems used in such a system and more particularly to that portion of the system which processes a set of electric current measurements obtained by another portion of the system and produces an indication of "good" or "bad" if the motor appears to be functioning normally or abnormally, respectively.

Reference is made to the following applications with closely related subject matter whereof the disclosure is herein incorporated by reference: A NEURAL NETWORK AUTOASSOCIATOR AND METHOD FOR INDUCTION MOTOR MONITORING, filed on even date herewith in the names of Thomas Petsche and Stephen Hanson and METHOD AND APPARATUS FOR PREDICTING ELECTRIC INDUCTION MACHINE FAILURE DURING OPERATION, Ser. No. 08/251,814, filed on May 31, 1994 in the names of S. Farag, J. Schlag, T. Habetter, and B. Lin.

Electric motors are used extensively in a wide range of articles of manufacture and are a common component in much industrial and consumer equipment and in numerous installations and vehicles. Electric motors are utilized in many applications where they are expected to run with minimal attention and to provide reliable service. Depending on the application, the failure of an electric motor in service can possibly lead to an undesirable situation characterized by inconvenience, economic dislocation, expensive industrial consequences and/or, in some applications, hazardous situations. It is therefore important that fault diagnosis be done efficiently and automatically where possible. Absent special monitoring techniques, some electric motor failure modes and mechanisms tend to be insidious in their onset. For example, bearing problems, such as may occur through lubrication failure or other cause may not manifest themselves to an equipment operator until a serious fault situation has developed. For another example, insulation failures and other electrical problems may not become apparent until irreversible damage has occurred. And yet, because of the competitiveness of the mature market in electric motors, fault detection must be performed economically.

In the testing of motors, it is known to provide apparatus which will indicate electrically selected characteristics of motors, as described, for example in U.S. Pat. No. 3,052,117, entitled MOTOR TESTING APPARATUS issued Sep. 4, 1962 in the name of Miller et al. Monitoring and analyzing the "noise signature" of electric motor-operated devices is also known in the art. Thus, in U.S. Pat. No. 4,965,513, entitled MOTOR CURRENT SIGNATURE ANALYSIS METHOD FOR DIAGNOSING MOTOR OPERATED DEVICES issued Oct. 23, 1990 in the name of Haynes et al, it is disclosed that the signature may be recorded and compared with subsequent signatures to detect operating abnormalities and degradation.

Current sensing may be used in this procedure. U.S. Pat. No. 4,743,818 entitled MICROPROCESSOR BASED MOTOR PROTECTIVE RELAY WITH ROTOR TEMPERATURE DETECTOR, issued May 10, 1988 in the name of Quayle et al, discloses a motor protection relay in which the temperature of a rotating motor is inferred from the current flow in the lines which supply the motor and from resistance temperature detection devices in the stator, under microprocessor control.

U.S. Pat. No. 4,647,825 entitled UP-TO-SPEED ENABLE FOR JAM UNDER LOAD AND PHASE LOSS, issued Mar. 3, 1987 in the name of Profio et al, discloses a motor controller with a device responsive to a motor condition for preventing termination of power to the motor in response to fault conditions when these fault conditions occur during the start-up of the motor.

In U.S. Pat. No. 4,608,619 entitled GROUND FAULT VOLTAGE LIMITING FOR A LOCOMOTIVE ELECTRIC TRACTION MOTOR, issued Aug. 26, 1986 in the name of Bomer et al, the traction motors of a locomotive are voltage limited to a variable extent to permit continued motor operation following the occurrence of moisture induced ground faulting. Heating in operation dries the moisture.

U.S. Pat. No. 4,547,826 entitled GENERALIZED REAL-TIME THERMAL MODEL, issued Oct. 15, 1985 in the name of Premeriani, discloses a real-time thermal model of an induction motor to produce values indicative of the transient and steady state temperature condition of the motor. The values are compared with predetermined limits to remove power when a value exceeds its limit in order to prevent damage to the motor.

U.S. Pat. No. 4,544,982 entitled ELECTRICAL EQUIPMENT PROTECTION APPARATUS AND METHOD, issued Oct. 1, 1988 in the name of Boothman et al, discloses protection of three phase electrical equipment where a current-representative signal is derived for each phase and the three signals are combined to form an analog composite signal. Heating in the equipment is determined from the signals and when the temperature exceeds a critical value, power is interrupted. Phase loss and phase unbalance are determined and the power supply is interrupted when either exceeds a critical level.

U.S. Pat. No. 4,467,260 entitled MOTOR CONTROL APPARATUS WITH ROTOR HEATING PROTECTION, issued Aug. 21, 1984 in the name of Mallick, Jr. et al discloses a microprocessor controlled motor starter. When the short term differential temperature between rotor bars and rotor end bells is excessive, the motor is shut down.

A solid state thermal overload indicator is disclosed in U.S. Pat. No. 3,845,354, entitled SOLID STATE THERMAL OVERLOAD issued Oct. 29, 1974 in the name of Boothman et al, in which analog means are used for accounting for the heat energy stored in the motor. An analog of the electrical thermal characteristics of the load is provided so that its operating characteristic more closely resembles the load's thermal damage curve. The patent discloses an indicator for a motor load which has independently adjustable stall operating time and running overload trip level.

U.S. Pat. No. 3,809,960, entitled HEATING INDICATING DEVICE OF AN ELECTRIC MOTOR issued May 7, 1974 in the name of Jossic, discloses a heating indicating device for the rotor of an electric motor using direct current. A device is disclosed using a resistor in series with the rotor for monitoring and utilizing the voltage across the resistor to provide for temperature monitoring.

U.S. Pat. No. 5,270,640, entitled issued Dec. 14, 1993 in the name of Kohler et al. discloses a method for detecting an incident failure in a multiphase electric motor, comprising monitoring voltage and current values at each input to the motor, determining negative sequence voltage and current values for each periodic measured input voltage and current value, calculating an effective negative sequence impedane phasor value angle from each of the determined negative sequence voltage and current values, and comparing the calculated negative sequence impedance phasor angles and/ or real and imaginary components over a plurality of periodic measurements to detect a change therein, which change is said to be indicative of an incipient failure mode.

A signal processing system is disclosed in U.S. Pat. No. 4,423,458 entitled SIGNAL PROCESSING SYSTEM FOR OVERLOAD RELAY OR THE LIKE, issued Dec. 27, 1983 in the name of Stich. A system is used for sensing current flow in a single phase or polyphase circuit to be protected and deriving a single signal representing composite current flow. The cooling of protected circuit elements is represented.

A control capable of monitoring single phase or polyphase current flow is disclosed in U.S. Pat. No. 4,423,459 entitled SOLID STATE CIRCUIT PROTECTION SYSTEM AND METHOD, issued Dec. 27, 1983 in the name of Stich et al. Current imbalance is recognized and compensated.

A control is disclosed in U.S. Pat. No. 4,446,498 entitled ELECTRONIC CONTROL SYSTEM FOR OVERLOAD RELAY OR THE LIKE, issued May 1, 1984 in the name of Stich, for monitoring single phase or polyphase current flow. An interrupter is tripped when an overcurrent condition occurs.

A method and apparatus for detecting axial cracks in rotors for rotating machinery are disclosed in U.S. Pat. No. 4,751,657 entitled METHOD AND APPARATUS FOR DETECTING AXIAL CRACKS IN ROTORS FOR ROTATING MACHINERY, issued Jun. 14, 1988, in the name of Imam et al.

In accordance with an aspect of the invention, a method for detecting a departure from normal operation of an electric motor comprises obtaining a set of normal current measurements for a motor being monitored; training a neural network auto-associator using the set of normal current measurements; making current measurements for the motor in operation; comparing the current measurements with the normal current measurements; and indicating abnormal operation whenever the current measurements deviate significantly the normal current measurements.

In accordance with another aspect of the invention, the method models a set of normal current measurements for the motor being monitored, and indicates a potential failure whenever measurements from the motor deviate significantly from a model.

In accordance with an aspect of the invention, apparatus for detecting a departure from normal operation of an electric motor, comprises: sensing apparatus for measuring a set of current values for a motor being monitored; first processing apparatus coupled to the sensing apparatus for deriving frequency spectral components associated with the set of current values; a neural network auto-associator coupled to the signal processing apparatus and further coupled to the sensing apparatus for receiving at least one of at least a portion of the spectral components and at least a portion of the current values as an input vector and having output terminals for providing an output vector, the neural network having undergone a training phase; and second processing apparatus coupled to the output terminals for comparing the input and output vectors for providing an error metric, wherein the first processing apparatus clusters the frequency spectral components into a smaller number of clusters during the training phase.

In accordance with another aspect of the invention, the first processing apparatus performs a Fast Fourier Transform (FFT).

In accordance with a further aspect of the invention, the current values correspond to instantaneous values of current.

In accordance with a further aspect of the invention, the clustering is performed by use of a K-apparatus clustering algorithm.

In accordance with a further aspect of the invention, apparatus for detecting a departure from normal operation of an electric motor, comprises sensing apparatus for measuring a set of current values for a motor being monitored; first processing apparatus coupled to the sensing apparatus for deriving frequency spectral components associated with the set of current values in accordance with a Fast Fourier Transform (FFT), for scaling the frequency spectral components in accordance with predetermined weights; a neural network auto-associator coupled to the signal processing apparatus and further coupled to the sensing apparatus for receiving at least one of a selected portion of the frequency spectral components and a portion of the current values as an input vector and having output terminals for providing an output vector, and including a hidden layer, the autoassociator having been trained in a training phase, using a set of current values obtained from a motor known to be operating normally, the first processing apparatus having clustered the frequency spectral components into a smaller number of clusters during the training phase; and second processing apparatus coupled to the output terminals for comparing the input and output vectors for providing an error metric.

In accordance with another aspect of the invention, $\Phi$ is defined as the $i^{th}$ component of the frequency spectral components (FFT components), and for each FFT component, the first processing apparatus provides a quantity $x_i$, where $$x_i = \frac{1}{\max_{j \in \tau} \Phi_j} (\Phi - \min_{j \in \tau} \Phi_j), \quad \text{Equation (1)}$$

where $\tau$ is a user defined index set that selects some subset of the components of the FFT for defining the portion of the frequency spectral components, $\tau$ containing L elements, the L elements being normalized with respect to the largest and smallest elements thereof, a resulting set of L scaled magnitude components $x_0, \ldots, X_{L-1}$, being defined to represent the maximum RMS value of the current values being monitored.

In accordance with another aspect of the invention, a method for detecting a departure from normal operation of an electric motor, comprises:

obtaining a set of current measurements for a motor being monitored, the motor being known to be operating normally;

applying the set of current measurements to neural network auto-associator and training the neural network auto-associator using the set of normal current measurements;

making a set of operational current measurements for the motor in actual operation;

forming clusters of operational current measurements;

applying the clusters of operational current measurements to the neural network auto-associator;

comparing the set of clusters of current measurements with the output of the neural network auto-associator;

indicating abnormal operation whenever the comparing produces a result in accordance with predetermined criteria.

In accordance with still a further aspect of the invention, a method for detecting a departure from normal operation of an electric motor, comprises:

obtaining a set of current measurements for a motor being monitored during a training phase, the motor being known to be operating normally;

processing the set of current measurements so as to provide current measurement training vectors;

forming clusters of the current measurement vectors during the training phase;

applying the clusters of current measurement vector to a neural network auto-associator and training the neural network auto-associator using the set of normal current measurements;

making a set of operational current measurements for the motor in actual operation;

processing the of operational current measurements so as to provide an operational current measurement vector;

applying the operational current measurement vector to the neural network auto-associator;

comparing the set of current measurements with the output of the neural network auto-associator; and indicating abnormal operation whenever the comparing produces a result in accordance with predetermined criteria.

Figure 2:
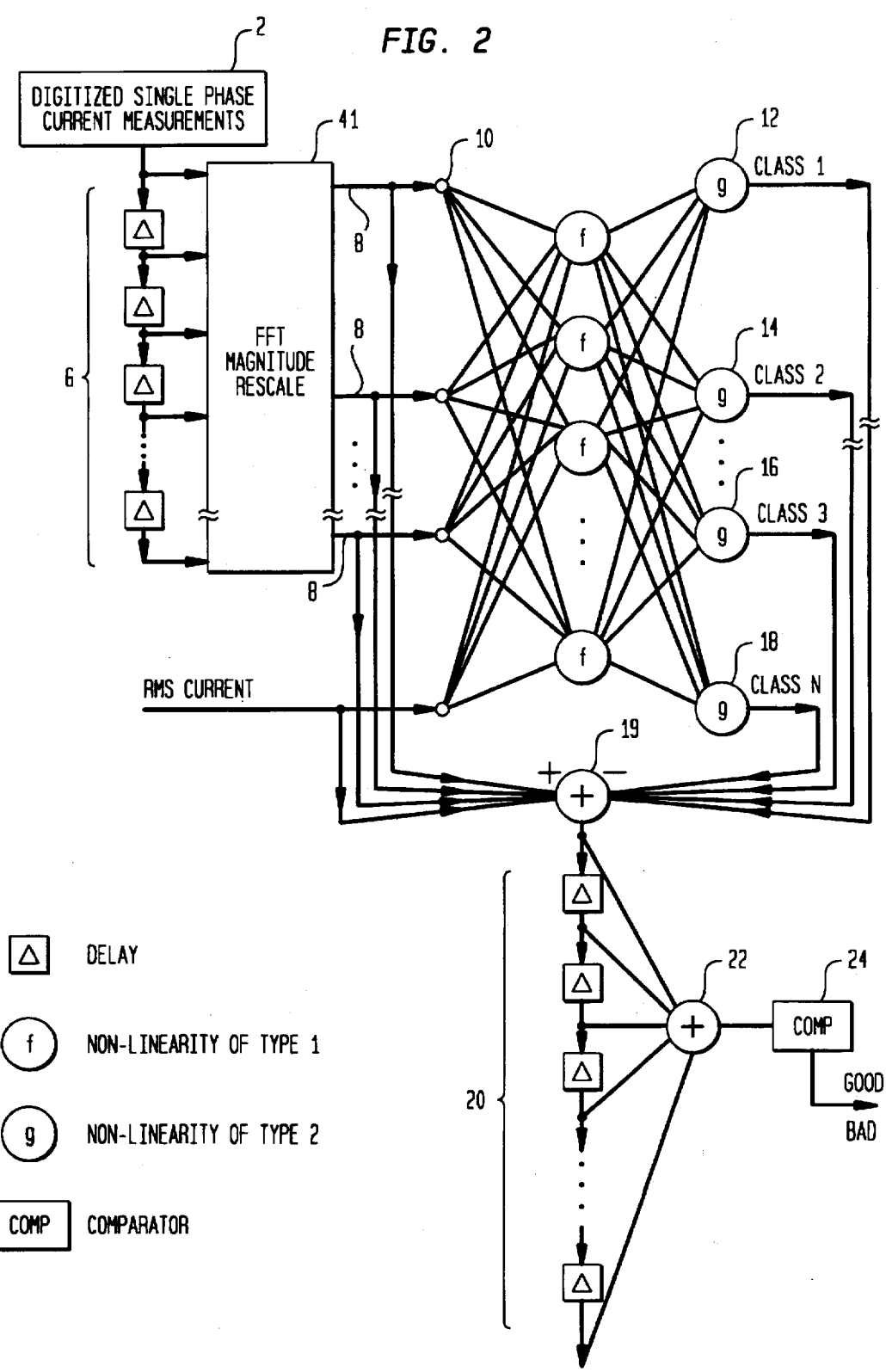

For a further understanding of the present invention, reference is made to the following description of an exemplary embodiment thereof, considered in conjunction with the accompanying drawings, in which:

FIG. 1 is a general block diagram depicting an artificial neural network autoassociator according to the present invention; and FIG. 2 is a block diagram showing an artificial neural network coupled to a computational element which computes the FFT of a set of recent current measurements and from whose output it receives its input.

The term neural network or, more properly, artificial neural network (ANN), has come to mean any computing architecture that consists essentially of massively parallel interconnections of simple "neural" processors. Neural networks are used in pattern classification by defining non-linear regions in the feature space. While neural networks are relatively new in regard to operation, they have been investigated by researchers for many years. For example, see The Proceedings Of The IEEE, September 1990, Special Issue on Neural Networks, Vol. 8, No. 9, pp. 1409–1544. For a further example, reference is made to pending U.S. patent application Ser. No. 07/899,808 filed Jun. 17, 1992 in the name of Marcantonio for ARTIFICIAL NEURAL NETWORK (ANN) CLASSIFIER APPARATUS FOR SELECTING RELATED COMPUTER ROUTINES AND METHODS and whereof the disclosure is herein incorporated by reference. Thus, neural networks of many different types of configurations and uses are well known.

The basic building block used in many neural networks is the adaptive linear element. This is an adaptive threshold logic element which comprises an adaptive linear combiner cascaded with a hard limiting quantizer which is used to produce a binary output. In single element neural elements, an adaptive algorithm is often used to adjust the weights of the adaptive linear element so that it responds correctly to as many patterns as possible in a training set that has binary desired responses. Once the weights are adjusted, the responses of the trained element can be tested by applying various input patterns. If the adaptive linear element responds correctly with high probability to input patterns that were not included in the training set, it is said that "generalization" has taken place. Thus, learning and generalization are among the most useful attributes of adaptive linear elements in neural networks. A single adaptive linear element is capable of realizing only a small subset of certain logic functions known as the linearly separable logic functions or threshold logic functions. These are the set of logic functions that can be obtained with all possible weight variations. Thus, such classifiers are sometimes referred to as linear classifiers. The linear classifier is limited in its capacity and is limited to only linearly separable forms of pattern discrimination.

More sophisticated classifiers with higher capacities are non-linear. Of two types of non-linear classifiers which are known in the art, the first is a fixed pre-processing network connected to a single adaptive element and the other is the multi-element feed forward neural network. These networks, as well as operations and configurations thereof, are known in the prior art and are described, for example, in the above-noted publication in an article entitled "Thirty Years of Adaptive Neural Networks: Perception, Madaline, and Backpropagation" by Bernard Widrow et al. in Proceedings of the IEEE, Vol. 78, No. 9, September, 1990, pp. 1415–1441. The article, besides describing the history of neural networks as of the publication date, also has an extensive bibliography in regard to the same. The teaching of this article is hereby incorporated by reference, as is also the earlier cited literature, as background material to the present invention.

In accordance with the invention, the model takes the form of an neural network auto-associator which is "trained"—using current measurements collected while the motor is known to be in a normal operating condition—to reproduce the inputs on the output. A new set of current measurements are classified as "good" or "bad" by first transforming the measurement using a Fast Fourier Transform (FFT) and an internal scaling procedure, and then applying a subset of the transformed measurements as inputs to the neural network auto-associator. A decision is generated based on the difference between the input and output of the network.

Use of the FFT causes a fault to introduce or increase the magnitude of a narrow bandwidth oscillation in the current. This is seen in the FFT as an increase in the magnitude of the spectrum in a narrow range of frequencies. The particular "internal scaling procedure" is utilized because the inventors have found that, given a set of FFTs which the network was to be trained to recognize, it was more effective to scale each FFT individually rather than to apply the same scale factors to all the FFTs. It is herein recognized that this suggests that the shape of the spectrum is more important than the absolute magnitudes, though a facile explanation of why it works better is not apparent at this point.

A decision is generated based on the difference between the input and output of the network. The network is "trying" to reproduce the input vector. The "classification" is then done by comparing the input and output vectors and "measuring the difference". A useful way to view the task of the neural net is to consider an example. Thus, given, for example, a 129 dimensional input vector, the network compresses this vector into a 20 dimensional vector (on the hidden units) and then expands that back onto the 129 dimensional output vector. The "bottleneck" at the hidden layer forces the network to extract only the 20 most important directions in the input space. Thus, the output will most likely never be exactly the same as the input. But, for input vectors that are "close to" the vectors on which the network was trained, the Euclidean distance, for example, between the input and output vectors will be small.

Thus the "difference between input and output vectors" is a measure of the difference between the input vector that the output vector produced by the trained network when that input is applied. Generally herein, the Euclidean distance is used, namely $$d_r = \sqrt{\left\{ \sum_{i=0}^{N} (X_i - Y_i)^2 \right\}}$$

Nevertheless, other $L_p$ norms have been used, e.g.

$$\left\{ d_p = \sum_{i=0}^{N} (X_i - Y_i)^p \right\}^{1/p}.$$

Also, it is herein recognized that the discrimination of the system may be improved if only selected components are used to compute the difference. In other words, rather than summing over all the components, as the $d_p$, the sum would contain only a subset of the components and ignore the rest. Again, this is motivated by the physics of the system, which predicts that the spectrum of a faulty motor will contain narrow peaks in predictable frequency spectral locations caused by the fault, while peaks in other locations are predicted to be due to external noise.

In accordance with an exemplary embodiment of the invention, a labeling procedure implemented in software will be described as well as an equivalent hardware implementation. The procedure used to initially adapt the system to a new motor will then be explained. This same procedure is also used to adapt the system to any changes in the load or environment. Embodiments herein described have been implemented in software that runs on a workstation or PC.

A subsystem is employed which measures the instantaneous current on a single phase of the power supply to a three phase electric induction motor and the RMS current on all three phases. Such a subsystem uses standard techniques known in the art. The single phase current measurements at time t are herein referred to as $c_t$, and the RMS current as $r_t$.

These measurements are collected beginning at some time arbitrarily called 0 (zero). At time K−1, the K measures $c_0$, ..., $c_{K-1}$ are transformed using a Fast Fourier Transform (FFT) to produce an estimate of the magnitudes of the frequency spectrum components of the signal. In the implementation of the described embodiment, values have been used of k=4096 or 16384. Calling the magnitude of the ith component of the FFT $\phi_i$, this signal is further processed by scaling each component by the inverse of the magnitude of the largest component in the FFT, i.e., the FFT is scaled so that the relative magnitudes remain constant and the range of magnitudes cover [0,1].

In one instantiation, for each FFT (independent of all other FFTs)

$$x_i = \frac{1}{\max_{j \in \tau} \Phi_j} (\phi - \min_{j \in \tau}) \Phi_j \qquad \text{Equation (1)}$$

is computed, where $\tau$ is a user defined index set that selects some subset of the components of the FFT. Assume $\tau$ contains L elements. In other words, the user defines a subset of the components of the FFTs that are included, the choice of which FFT components being guided by the physics of the system and experience with similar problems.

The remaining components are discarded. For each subsampled FFT, the system finds the largest and the smallest components. The subsampled FFT is then translated and scaled so that the largest component maps to 1, or some other upper bound less than 1 and the smallest to 0 or some other lower bound greater than 0. In the present work, 0.98 and 0.02, respectively have frequently been used.

Calling the resulting set of L scaled magnitude components $x_0, \ldots, x_{L-1}$, $r_{max}$ is defined to be the maximum RMS current. The following are defined:

$$x_L = \frac{1}{r_{max}} \frac{1}{k} \sum_{i=0}^{K/2-1} r_t$$

and $X = x_0, \ldots, x_L$. Thus, the vector X consists of L scaled components of the FFT plus the scaled RMS current.

The vector X is applied as input to a neural network with a single hidden layer of radial basis function units and an output layer of linear units. The basis functions are spherical gaussians with variable center and width. The network can be described as:

$$Y_i = \sigma \left\{ \sum_{j=0}^{H-1} w_{i,j} \exp\{ -\|Y - c_j\|^2 / \sigma_j^2 \} - \Theta_i \right\} \qquad \text{Equation (2)}$$

Where $Y_i$ (i=0, ..., L) is the ith output node of the network; H is the number of nodes in the hidden layer; $w_{i,j}$ is a weight on the output of hidden unit j when applied as input to output unit i; $\Theta$ is the threshold for output unit i; and $\sigma(u) = (1+e^{-u})^{-1}$ where e is the base of the natural logarithm. (In FIG. 1, $f(x) \exp\{(X-c_j)^2/\sigma_j^2\}$ and $g=\sigma$.) Other functions for f and g may also be used. $c_j$ is the center of hidden unit j and $\sigma_j$ is its width.

Given the $x_i$ and $x_i$, an error metric $$d = (1/(L+1)) \sum_{i=0}^{L} (x_i - x_i)^2$$

is computed.

This same procedure is repeated a total of T times to generate T error metrics $d_1, \ldots d_T$. The system then indicates that the motor is "good" if $$\sum_{i=0}^{T} d_i \leq \Theta$$

and that it is bad otherwise.

The entire labeling procedure then begins again.

A hardware implementation of this labeling procedure is shown in FIG. 1. Other implementations are possible.

The uniqueness and effectiveness of the motor monitoring system in accordance with the present invention stems from its ability to adapt to the particular motor that it is monitoring. This means that when the system is first installed, the $w_{i,j}$, $q_j$, $c_j$, $s_j^2$ are all randomly chosen or completely unknown when the system is exposed to a motor for the first time. The problem the system faces is to estimate good values for these parameters. Further, if the environment or the load that the motor is driving changes, the system will need to re-estimate these parameters.

The parameters are estimated by collecting a large set of current measurements during the period immediately after the monitor is installed and while the motor is assumed to be "healthy", that is, in good running order. It is expected that a motor can be sampled periodically over the course of a week to generate this training set. The data is then segmented into vectors of length K (as above) and the same preprocessing—i.e., FFT and rescaling—as above is applied to each vector. For ease of explanation, assume that K * M current measurements $c_0, \ldots, C_{KM-1}$ have been collected and processed to produce M vectors $X^1, \ldots, X^M$.

The first step in training the network is to place the centers of the radial basis functions near the input data. A K-means clustering algorithm is herein used to group the M input measurements into H clusters. K-means works by ransom;y selecting H inputs as the initial cluster centers. Then it assigns every input to the nearest cluster center and moves each cluster center to the mean position of that cluster's members. The two steps of assigning to clusters and moving v cluster centers repeat until no points change clusters during the assignment phase. After the clustering, the basis function widths, $\sigma_j$, are set to the Euclidian distance from cluster j to its nearest neighbor. The output layer weights and thresholds are initialized to 0. The present invention differs specifically from the aforementioned co-pending application in the K-means clustering is necessary for the radial basis function network to operate properly and cannot be used in the network of the aforementioned application.

After the initialization phase, any one of many optimization algorithms, usually simple gradient descent, or aka error back propagation, may be used to choose the weights and thresholds in the neural network to minimize the mean square error, $$E = \frac{1}{ML} \sum_{m=1}^{N} \sum_{i=0}^{L} (x_i - x_i)^2 \qquad \text{Equation (3)}$$

Given these estimates of the network parameters, on the same training set or another one, $$d_j = \frac{1}{(L+1)} \sum_{i=0}^{L} (x_i - x_i)^2$$

is computed for j=1, ..., N. Then, an estimate is made of $\Theta$ as $\Theta = \mu + as$, where $$\mu = \frac{1}{N} \sum_{i=1}^{N} d_j$$

and $$s = \left( \sum_{j=1}^{N} d_j^2 \right) / N - \mu^2)^{1/2}$$

and a is a user definable parameter, herein taken to be 1.

As an alternative, order statistics can also be used to estimate $\Theta$ such that $\Theta = m + ar$ where m is the median of the $d_i$ and r is the distance between the upper and lower quartiles of the $d_i$. (The median of a set of numbers $x_1, \ldots, x_N$, is $x^*$ if the number of $x_i$ such that $x_i \geq x^*$ is the same as the number of $x_i$ such that $x_i \leq x^*$. The upper quartile of the set is $x_u$ such that ¼ of the $x_i$ are greater than $x_u$ and ¾ are less than $x_u$. The lower quartile of the set is $x_u$ such that ¼ of the $x_i$ are less than $x_u$ and ¾ are greater than $x_u$.) Again, a is a user definable parameter. Some other range for R can also be used such as the smallest range that includes all the data except the upper and lower 10%.

FIG. 1 illustrates what is generally known as a neural network autoassociator. The input and output layers each contain the same number of units. The task of an autoassociator is to reproduce the input vector on the output units (i.e., do not label the outputs "1 of n"). If there were no hidden layer, or the hidden layer contained as many units as the input and output layers, this task could be performed by a simple identity mapping from each layer to the next. However, since there are fewer hidden units than input units, the system must compress the input vectors and then expand them onto the output. Thus the hidden layer can represent only a subset of the input space.

As will be seen, each of the modules referenced by numerals 10, 11 and 12 and the remaining modules pertain to processing elements which appear in the system. The connections between the modules represent the connection weights, as is well known. Thus, for example, each of the modules 10, 11 and 12 may represent first layer adaptive linear elements, second layer or third layer adaptive linear elements with each of the output stages, such as 12, representing an output layer adaptive linear element or a trainable layered neural network with multiple adaptive elements.

Referring to FIG. 2, digitized single phase motor current measurements are applied to a signal processing unit 4 by way of a series of delay elements, generally indicated as 6. The motor and signal sensing arrangements are conventional and are not shown. For example, current transformers or sensing resistors and the like may be used. Signal processing unit 4 performs appropriate magnitude rescaling and derives the Fast Fourier Transform of the applied signals. The outputs of signal processing unit 4 are applied to a series of input processing elements 10 of a neural network classifier such as was shown in FIG. 1. The outputs of the class modules, 12 through 18 are each directed to a computation network indicated as 20. Computation network 20 takes as input the inputs to the neural network and the outputs of the network and produces as output a metric representing the difference between the input and output vectors. For example, if Euclidean distance is being used and the input vector is $X_1, \ldots, X_n$, and the output vector is $Y_1 \ldots Y_n$ the output of "A" is the value $$d_E = \sqrt{\left\{ \sum_{i=0}^{n} (X_i - Y_i)^2 \right\}}.$$

The boxes labeled 6, containing the character are for providing delays, so the adder 22 takes as input a set of the k most recent values of the difference between the input and output of the neural network and produces as output either the sum or average (equivalently) of these values. The comparator 24 then compares this sum or average to a threshold and then indicates that the motor is good or bad depending on whether the input is above or below the threshold, respectively.

As one can understand, the invention has great applicability and the essence of the invention is quite general in its applicability and can be used in a wide variety of neural network classifier implementations. While the invention has been explained by way of specific, exemplary embodiments, it will be understood by those skilled in the art that various changes and modifications can be incorporated without departing from the spirit and scope of the invention which is defined by the claims following. Thus, while current sampling relating to a single phase has been referred to, the method is clearly applicable to single phase and polyphase apparatus. Furthermore, it is not essential that the supply current itself be monitored: it is entirely within the contemplation of the invention to monitor auxiliary currents which nevertheless incorporate information relating to motor condition. The method is generally applicable to electrodynamic machinery, including motors and generating equipment. Clearly, the method is suitable for implementation by general purpose computer, dedicated computer, or by specialized electronic circuitry.

What is claimed is:

1. A method for detecting a departure from normal operation of an electric motor, comprising:

modelling a set of normal current measurements for a motor being monitored;

modelling a set of operational current measurements for said motor being monitored, wherein said modelling is carried out by a neural network auto-associator which is trained to reproduce its inputs on its output;

indicating a potential failure whenever said set of normal current measurements and said set of operational current measurements differ by more than a predetermined criterion.

2. A method for detecting a departure from normal operation of an electric motor in accordance with claim 1 wherein new sets of current measurements are classified as "good" or "bad" by first transforming the measurement using a Fast Fourier Transform (FFT) and an internal scaling procedure, and then applying a subset of the transformed measurements as inputs to the neural network auto-associator, whereby a decision is generated based on the difference between the input and output of the network.

3. A method for detecting a departure from normal operation of an electric motor in accordance with claim 2 wherein said neural network auto-associator is trained utilizing current measurements collected using an electric motor known to be in a normal operating condition.

4. A method for detecting a departure from normal operation of an electric motor in accordance with claim 3 wherein said subset of the transformed measurements is user-definable.

* * * * *